(12) United States Patent
Gan et al.

(10) Patent No.: US 6,772,405 B1
(45) Date of Patent: Aug. 3, 2004

(54) INSERTABLE BLOCK TILE FOR INTERCONNECTING TO A DEVICE EMBEDDED IN AN INTEGRATED CIRCUIT

(75) Inventors: Andy H. Gan, San Jose, CA (US); Nigel G. Herron, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 52 days.

(21) Appl. No.: 10/172,431

(22) Filed: Jun. 13, 2002

(51) Int. Cl.[7] .............................................. G06F 17/50
(52) U.S. Cl. .......................... 716/11; 703/18; 714/738; 716/2; 716/12; 716/15
(58) Field of Search .......................... 703/18; 714/738; 716/2, 12, 15, 1, 6, 11, 17; 438/12

(56) References Cited

U.S. PATENT DOCUMENTS

| | | | |
|---|---|---|---|
| 4,758,985 | A | 7/1988 | Carter |
| 4,855,669 | A | 8/1989 | Mahoney |
| 5,072,418 | A | 12/1991 | Boutaud et al. |
| 5,142,625 | A | 8/1992 | Nakai |
| RE34,363 | E | 8/1993 | Freeman |
| 5,274,570 | A | 12/1993 | Izumi et al. |
| 5,311,114 | A | 5/1994 | Sambamurthy et al. |
| 5,339,262 | A | 8/1994 | Rostoker et al. |
| 5,347,181 | A | 9/1994 | Ashby et al. |
| 5,361,373 | A | 11/1994 | Gilson |

(List continued on next page.)

FOREIGN PATENT DOCUMENTS

| | | |
|---|---|---|
| EP | 0315275 A2 | 10/1989 |
| EP | 0 905 906 A2 | 3/1999 |
| EP | 1 235 351 A1 | 8/2002 |
| WO | WO 93 25968 A1 | 12/1993 |

OTHER PUBLICATIONS

Sayfe Kiaei et al., "VLSI Design of Dynamically Reconfigurable Array Processor–Drap," IEEE, Feb. 1989, pp. 2484–2488, V3.6, IEEE, 3 Park Avenue, 17th Floor, New York, NY 10016–5997.

Vason P. Srini, "Field Programmable Gate Array (FPGA) Implementation of Digital Systems: An Alternative to Asic," IEEE, May 1991, pp. 309–314, IEEE, 3 Park Avenue, 17th Floor, New York, NY 10016–5997.

G. Maki et al., "A Reconfigurable Data Path Processor," IEEE, Aug. 1991, pp. 18–4.1 to 18–4.4, IEEE, 3 Park Avenue, 17th Floor, New York, NY 10016–5997.

Jacob Davidson, "FPGA Implementation of Reconfigurable Microprocessor," IEEE, Mar. 1993, pp. 3.2.1–3.2.4, IEEE, 3 Park Avenue, 17th Floor, New York, NY 10016–5997.

Christian Iseli et al., "Beyond Superscaler Using FPGA's," IEEE, Apr. 1993, pp. 486–490, IEEE, 3 Park Avenue, 17th Floor, New York, NY 10016–5997.

P.C. French et al., "A Self–Reconfiguring Processor,"; IEEE, Jul. 1993, pp. 50–59, IEEE, 3 Park Avenue, 17th Floor, New York, NY 10016–5997.

(List continued on next page.)

Primary Examiner—Thuan Do
(74) Attorney, Agent, or Firm—W. Eric Webostad (57) ABSTRACT

Method and apparatus for an insertable block tile is described. More particularly, a reserved area in an integrated circuit layout is removed, and terminated conductive line information is extracted from a layout database affected by the removal. The terminated conductive line information is used to create extensions or pins of the conductive lines terminated, as well as to identify signals associated with those terminated conductive lines. These physical or layout names and coordinates are mapped and then translated to logic names and coordinates for placement and routing to create the insertable block tile.

19 Claims, 5 Drawing Sheets

U.S. PATENT DOCUMENTS

| | | |
|---|---|---|
| 5,457,410 A | 10/1995 | Ting |
| 5,473,267 A | 12/1995 | Stansfield |
| 5,500,943 A | 3/1996 | Ho et al. |
| 5,504,738 A | 4/1996 | Sambamurthy et al. |
| 5,537,601 A | 7/1996 | Kimura et al. |
| 5,543,640 A | 8/1996 | Sutherland et al. |
| 5,550,782 A | 8/1996 | Cliff et al. |
| 5,552,722 A | 9/1996 | Kean |
| 5,574,930 A | 11/1996 | Halverson, Jr. et al. |
| 5,574,942 A | 11/1996 | Colwell et al. |
| 5,581,745 A | 12/1996 | Muraoka et al. |
| 5,600,845 A | 2/1997 | Gilson |
| 5,652,904 A | 7/1997 | Trimberger |
| 5,671,355 A | 9/1997 | Collins |
| 5,705,938 A | 1/1998 | Kean |
| 5,732,250 A | 3/1998 | Bates et al. |
| 5,737,631 A | 4/1998 | Trimberger |
| 5,740,404 A | 4/1998 | Baji |
| 5,742,179 A | 4/1998 | Sasaki |
| 5,742,180 A | 4/1998 | DeHon et al. |
| 5,748,979 A | 5/1998 | Trimberger |
| 5,752,035 A | 5/1998 | Trimberger |
| 5,760,607 A | 6/1998 | Leeds et al. |
| 5,809,517 A | 9/1998 | Shimura |
| 5,835,405 A | 11/1998 | Tsui et al. |
| 5,874,834 A | 2/1999 | New |
| 5,889,788 A | 3/1999 | Pressly et al. |
| 5,892,961 A | 4/1999 | Trimberger |
| 5,898,705 A * | 4/1999 | Graef ......................... 714/738 |
| 5,914,616 A | 6/1999 | Young et al. |
| 5,914,902 A | 6/1999 | Lawrence et al. |
| 5,933,023 A | 8/1999 | Young |
| 5,970,254 A | 10/1999 | Cooke et al. |
| 6,011,407 A | 1/2000 | New |
| 6,020,755 A | 2/2000 | Andrews et al. |
| 6,026,481 A | 2/2000 | New et al. |
| 6,096,091 A | 8/2000 | Hartmann |
| 6,154,051 A | 11/2000 | Nguyen et al. |
| 6,163,166 A | 12/2000 | Bielby et al. |
| 6,172,990 B1 | 1/2001 | Deb et al. |
| 6,178,541 B1 | 1/2001 | Joly et al. |
| 6,181,163 B1 | 1/2001 | Agrawal et al. |
| 6,211,697 B1 | 4/2001 | Lien et al. |
| 6,242,945 B1 | 6/2001 | New |
| 6,272,451 B1 | 8/2001 | Mason et al. |
| 6,279,045 B1 | 8/2001 | Muthujumaraswathy et al. |
| 6,282,627 B1 | 8/2001 | Wong et al. |
| 6,301,696 B1 | 10/2001 | Lien et al. |
| 6,311,147 B1 * | 10/2001 | Tuan et al. .................... 703/18 |
| 6,343,207 B1 | 1/2002 | Hessel et al. |
| 6,353,331 B1 | 3/2002 | Shimanek |
| 6,356,987 B1 | 3/2002 | Aulas |
| 6,389,558 B1 | 5/2002 | Herrmann et al. |
| 6,434,735 B1 | 8/2002 | Watkins |
| 6,438,729 B1 * | 8/2002 | Ho .............................. 716/1 |
| 6,460,172 B1 | 10/2002 | Insenser Farre et al. |
| 6,467,009 B1 | 10/2002 | Winegarden et al. |
| 6,483,342 B2 | 11/2002 | Britton et al. |
| 6,507,942 B1 | 1/2003 | Calderone et al. |
| 6,510,548 B1 | 1/2003 | Squires |
| 6,518,787 B1 | 2/2003 | Allegrucci et al. |
| 6,519,753 B1 | 2/2003 | Ang |
| 6,522,167 B1 | 2/2003 | Ansari et al. |
| 6,532,572 B1 | 3/2003 | Tetelbaum |
| 6,539,508 B1 | 3/2003 | Patrie et al. |
| 6,541,991 B1 | 4/2003 | Horncheck et al. |
| 6,578,174 B2 | 6/2003 | Zizzo |
| 6,587,995 B1 | 7/2003 | Duboc et al. |
| 6,588,006 B1 | 7/2003 | Watkins |
| 6,601,227 B1 | 7/2003 | Trimberger |
| 6,604,228 B1 | 8/2003 | Patel et al. |
| 6,611,951 B1 | 8/2003 | Tetelbaum et al. |
| 2001/0049813 A1 | 12/2001 | Chan et al. |
| 2002/0052053 A1 * | 5/2002 | Ono et al. .................... 438/12 |
| 2003/0062922 A1 | 4/2003 | Douglass et al. |

OTHER PUBLICATIONS

Christian Iseli et al., "Spyder: A Reconfigurable VLIW Processor Using FPGA's," IEEE, Jul. 1993, pp. 17–24, IEEE, 3 Park Avenue, 17th Floor, New York, NY 10016–5997.

Michael J. Wirthlin et al., "The Nano Processor: A Low Resource Reconfigurable Processor," IEEE, Feb. 1994, pp. 23–30, IEEE, 3 Park Avenue, 17th Floor, New York, NY 10016–5997.

William S. Carter, "The Future of Programmable Logic and Its Impact on Digital System Design," Apr. 1994, IEEE, pp. 10–16, IEEE, 3 Park Avenue, 17th Floor, New York, NY 10016–5997.

Andre' Dehon, "DPGA–Coupled Microprocessors: Commodity ICs for the Early 21st Century,"IEEE, Feb. 1994, pp. 31–39, IEEE, 3 Park Avenue, 17th Floor, New York, NY 10016–5997.

Osama T. Albaharna, "Area & Time Limitations of FPGA–Based Virtual Hardware," IEEE, Apr. 1994, pp. 184–189, IEEE, 3 Park Avenue, 17th Floor, New York, NY 10016–5997.

Xilinx, Inc., "The Programmable Logic Data Book," 1994, Revised 1995, Xilinx, Inc., 2100 Logic Drive, San Jose, CA. 95124.

Xilinx, Inc., "The Programmable Logic Data Book," 1994, Revised 1995, pp. 2–109 to 2–117, Xilinx, Inc., 2100 Logic Drive, San Jose, CA. 95124.

Xilinx, Inc., "The Programmable Logic Data Book," 1994, Revised 1995, pp. 2–9 to 2–18; 2–187 to 2–199, Xilinx, Inc., 2100 Logic Drive, San Jose, CA. 95124.

Xilinx, Inc., "The Programmable Logic Data Book," 1994, Revised 1995, pp. 2–107 to 2–108, Xilinx, Inc., 2100 Logic Drive, San Jose, CA. 95124.

Christian Iseli et al., "AC++Compiler for FPGA Custom Execution Units Synthesis," 1995, pp. 173–179, IEEE, 3 Park Avenue, 17th Floor, New York, NY 10016–5997.

International Business Machines, "PowerPC 405 Embedded Processor Core User Manual," 1996, 5th Ed., pp. 1–1 to X–16, International Business Machines, 1580 Rout 52, Bldg. 504, Hopewell Junction, NY 12533–6531.

Yamin Li et al., "Aizup–A Pipelined Processor Design & Implementation on Xilinx FPGA Chip," IEEE, Sep. 1996, pp. 98–106, 98–106, IEEE, 3 Park Avenue, 17th Floor, New York, NY 10016–5997.

Ralph D. Wittig et al., Onechip: An FPGA Processor with Reconfigurable Logic, Apr. 17, 1996, pp. 126–135, IEEE, 3 Park Avenue, 17th Floor, New York, NY 10016–5997.

Xilinx, Inc., "The Programmable Logic Data Book," Jan. 27, 1999, Ch. 3, pp. 3–1 to 3–50, Xilinx, Inc., 2100 Logic Drive, San Jose, CA 95124.

William B. Andrew et al., "A Field Programmable System Chip Which Combines FPGA & ASIC Circuitry," IEEE, May 16, 1999, pp. 183–186, IEEE, 3 Park Avenue, 17th Floor, New York, NY 10016–5997.

Xilinx, Inc., "The Programmable Logic Data Book," 2000, Ch. 3 pp. 3–1 to 3–117, Xilinx, Inc., 2100 Logic Drive, San Jose, CA 95124.

*Xilinx, Inc.*, "The Programmable Logic Data Book," 2000, Ch 3, pp. 3–7 to 3–17; 3–76 to 3–87, Xilinx, Inc., 2100 Logic Drive, San Jose, CA. 95124.

*International Business Machines*, "Processor Local Bus" Architecture Specifications, 32–Bit Implementation, Apr. 2000, First Edition, V2.9, pp. 1–76, IBM Corporation, Department H83A, P.O. Box 12195, Research Triangle Park, NC 27709.

*Xilinx, Inc.*, Virtex II Platform FPGA Handbook, Dec. 6, 2000, v1.1, pp. 33–75, Xilinx, Inc., 2100 Logic Drive, San Jose, CA. 95124.

*Cary D. Snyder et al.*, "Xilinx's A–to–Z System Platform," Cahners Microprocessor Report, Feb. 26, 2001, pp. 1–5, Microdesign Resources, www.MDRonline.com, 408–328–3900.

U.S. patent application Ser. No. 09/858,732, Schulz, filed May 15, 2001.

U.S. patent application Ser. No. 09/861,112, Dao et al., filed May 18, 2001.

U.S. patent application Ser. No. 09/917,304, Douglass et al., filed Jul. 27, 2001.

U.S. patent application Ser. No. 09/968,446, Douglass et al., filed Sep. 28, 2001.

U.S. patent application Ser. No. 09/991,410, Herron et al., filed Nov. 16, 2001.

U.S. patent application Ser. No. 09/991,412, Herron et al., filed Nov. 16, 2001.

U.S. patent application Ser. No. 10/001,871, Douglass et al., filed Nov. 19, 2001.

U.S. patent application Ser. No. 10/043,769, Schulz, filed Jan. 9, 2002.

* cited by examiner

INSERTABLE BLOCK TILE FOR INTERCONNECTING TO A DEVICE EMBEDDED IN AN INTEGRATED CIRCUIT

FIELD OF THE INVENTION

The present invention relates generally to method and apparatus for forming and insertable block tile, and more particularly to placement and routing of signals to and from a core embedded in a programmable logic device.

BACKGROUND OF THE INVENTION

Programmable logic devices exist as a well-known type of integrated circuit that may be programmed by a user to perform specific logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility and cost. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and programmable interconnect structure are conventionally programmed by learning a stream of configuration data (bit stream) into internal configuration memory cells, conventionally block random access memory (RAM) to define how the CLBs, IOBs, and programmable interconnect structure are configured.

Accordingly, when embedding a core, sometimes referred to as an embedded core, into an existing FPGA design, a portion of the FPGA layout is exchanged for layout of the embedded core. This is sometimes referred to as creating a "hole" in the "fabric" of the FPGA for insertion of an embedded core.

Once a portion of an FPGA is removed for an embedded core, signal lines, which may be thought of as conductive or metal lines, of the FPGA are abruptly terminated. Accordingly, for connecting an embedded core block to an FPGA, an area at the interface between the remaining part of the FPGA and the embedded core is reserved for interconnectivity. A layout engineer manually adjusts a layout working within this reserved operational interface area, i.e., namely creating FPGA-to-FPGA, FPGA-to-embedded core and embedded core-to-FPGA connections. This manual process is time consuming, especially in view of having to manually connect conductive lines in a limited space, which time intensive nature is exacerbated by having to search for metal levels.

Accordingly, it would be desirable and useful to provide method and apparatus for forming an insertable block tile for an embedded core into an existing integrated circuit layout that significantly reduces layout design time as compared to manual routing, as described above. More particularly, it would be desirable and useful if such method and apparatus could be integrated with place and route (P&R) tools.

SUMMARY OF THE INVENTION

An aspect of the present invention is a method for providing an insertable block tile for an integrated circuit having a region reserved for an embedded device. A physical layout database is provided for the integrated circuit. The region reserved is applied to the physical layout database. A portion of the physical layout database is removed in response to the region reserved. Terminated conductive line information is extracted from the physical layout database in response to the portion of the physical layout database removed. Layout names and associated coordinate information is identified for the terminated conductive line information extracted. The layout names are converted to schematic names. Logic names are mapped to the schematic names. The associated coordinate information is associated with the logic names to provide logic coordinate information.

An aspect of the present invention is an integrated circuit having an embedded core, where the embedded core is coupled to programmable logic to provide the integrated circuit. An input/output perimeter about the embedded core comprises a plurality of pins formed as extensions of conductive lines, whereby the pins are in integral alignment with the conductive lines for interconnecting the embedded core to the programmable logic.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
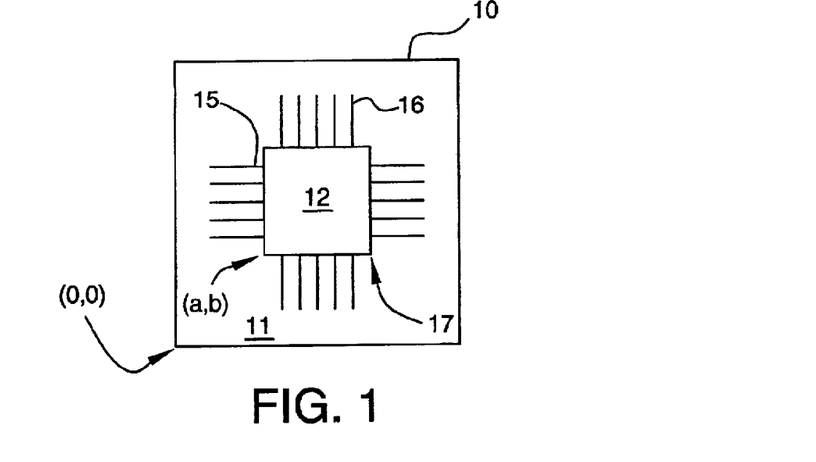
FIG. 1 is a block diagram of an exemplary embodiment of an integrated circuit comprising programmable logic and an embedded core region in accordance with one or more aspects of the present invention.

Referring to FIG. 1, there is shown a block diagram of an exemplary embodiment of an integrated circuit 10 comprising programmable logic 11 and embedded core region 12, including glue logic, if any, in accordance with one or more aspects of the present invention. Pluralities of interconnect conductive lines 15 and 16 are shown as terminating at embedded core region 12. Accordingly, it should be appreciated that a portion of programmable logic circuit, such as an FPGA, 11 is removed for providing a space for an embedded core, as well as glue logic. Notably, conductive lines 15 and 16 may be formed at different elevations or layers with respect to a substrate, as is well known. However, it should be understood that an embedded core, including any glue logic, need not necessarily be coupled to each metal layer of programmable logic circuit 11, and thus pluralities of lines 15 and 16 may represent selected metal layers. In this manner, not all conductive lines, such as metal lines, extending over embedded core region 12 need to be terminated at interface 17.

Figure 2:
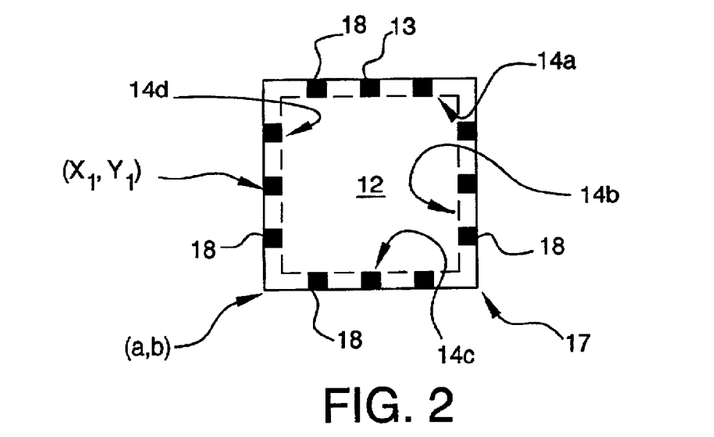
FIG. 2 is a block diagram of the embedded core region of FIG. 1 in accordance with one or more aspects of the present invention.

Referring to FIG. 2, there is shown a block diagram of embedded core region 12 of FIG. 1 in accordance with one or more aspects of the present invention. Reserved interconnect area 13 between interface boundary 17 and a reserved interconnect area boundary lines 14A through 14D is shown. Metal layer extensions 18 are extensions of conductive lines terminated at boundary 17, as described above with respect to FIG. 1. With continuing reference to FIG. 2 and renewed reference to FIG. 1, conductive line extensions 18 are cross sectionally equivalent to conductive lines 15 and 16 from which they extend; however the degree or the length to which conductive line extensions 18 extend into embedded core region 12 is determined by a layout designer engineer, as indicated by dashed lines 14A, 14B, 14C and 14D. Moreover, it should be appreciated that dashed lines 14A, 14B, 14C and 14D, do not need to be uniform with respect to the extent to which each extends into embedded core region 12. In other words, conductive line extensions 18 do not need to have uniform lengths, though for purposes of clarity of explanation it will be assumed that conductive line extensions 18 do have uniform lengths. It should be noted that input/output pins at the perimeter of the embedded core can be formed as conductive line extensions. Thus, conductive line extensions 18 may be referred to as pins 18.

For integrated circuit 10, an initial starting point at a corner may be (0,0). Thus, a corner of boundary 17 may have a coordinate (a,b) within a domain of integrated circuit 10. Pins 18 may be positioned according to a coordinate $(x_1,y_1)$. Notably, pins 18 have a cross-sectional width, and thus placement may take into account this dimension. For placement and routing (P&R) for creating an embedded block tile, coordinates for embedded core region 12 are translated. This reduces the area for which a P&R tool needs address, and thus further facilitates placement of embedded block tile into an existing layout of programmable logic circuit 11 having a reserved region 12 without need of manual pin interconnect.

Figure 3:
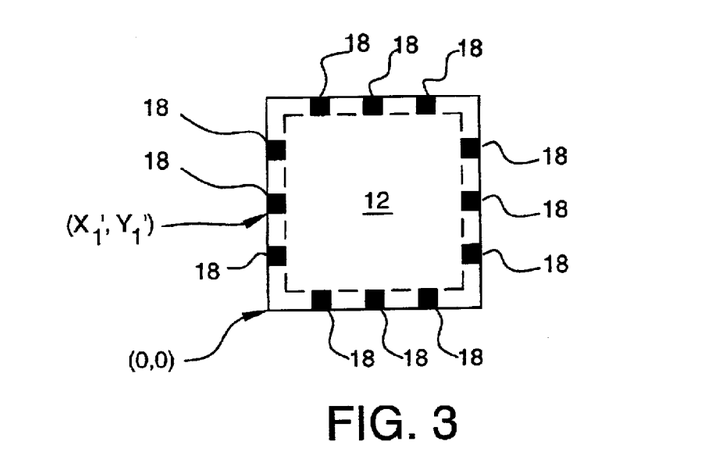
FIG. 3 is a block diagram of FIG. 2 with translated coordinates for an embedded core domain.

Referring to FIG. 3, there is shown a block diagram of FIG. 2 with translated coordinates for an embedded core domain. For example, coordinates (a,b) are translated to coordinates (0,0). Additionally, coordinates $(x_1, y_1)$ are translated to $(x_1',y_1')$. While one set of coordinates for a pin are described, it should be appreciated that multiple sets of coordinates for multiple pins may be used. It should be appreciated that extensions or pins 18 form a ring, more particularly an input/output (I/O) ring of abutting ports at a programmable logic circuit/embedded block boundary 17. This I/O ring may be used as physical pin information within a P&R database. An automated router may be used to route all embedded primary I/O to these physical pins 18. As is explained in more detail, an embedded block tile is created which may be directly placed into an existing layout, such as a layout for programmable logic device 11, without addition of any manual interconnect by a layout design engineer.

Figure 4:
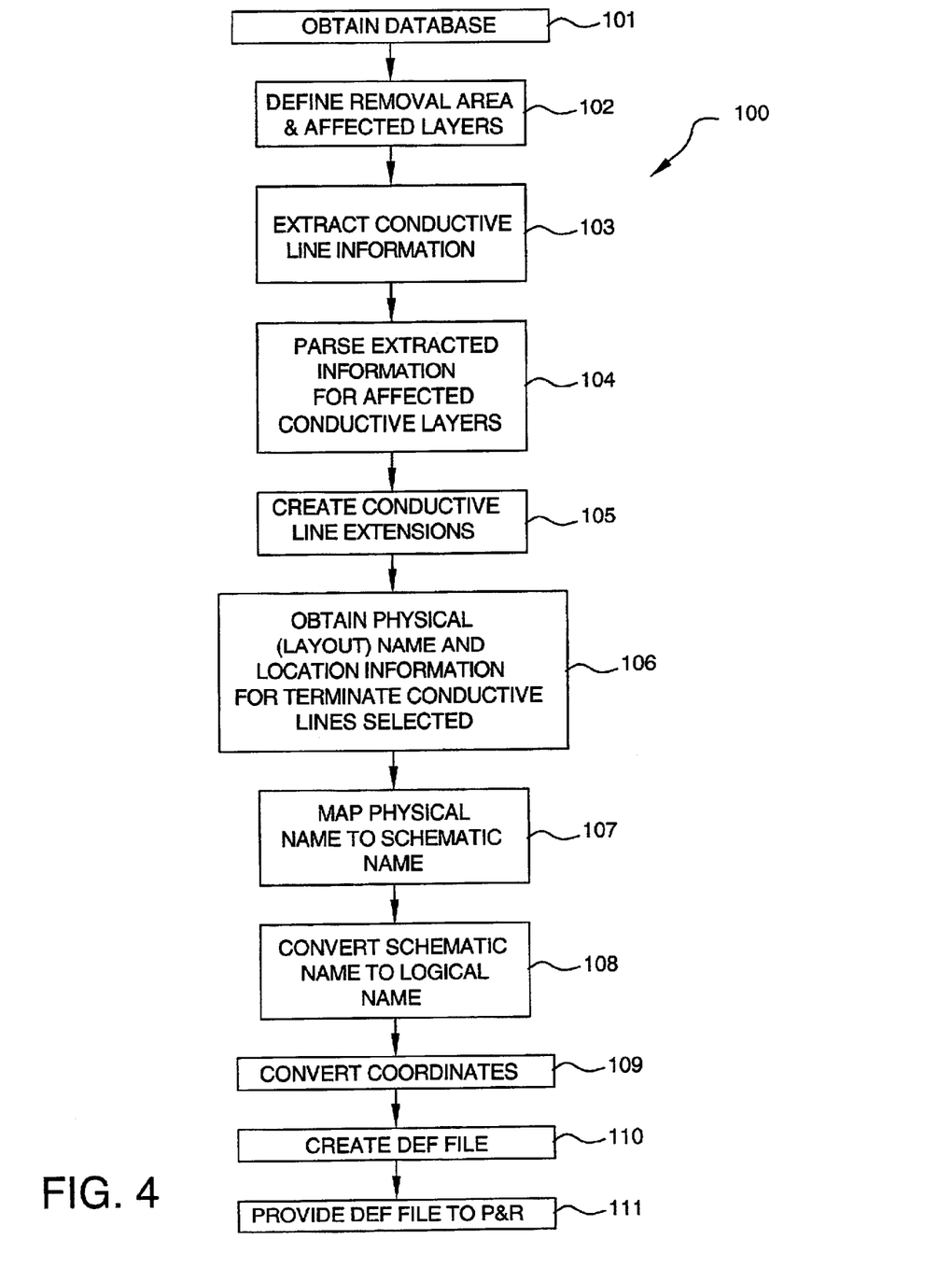
FIG. 4 is a process flow diagram of an embedded block tile process in accordance with one or more aspects of the present invention.

Referring to FIG. 4, there is shown a process flow diagram of an embedded block tile process 100 in accordance with one or more aspects of the present invention. At step 101, a physical layout database for an integrated circuit 100, prior to removal of circuitry in embedded core region 12, is obtained. Conventionally, a physical layout database is a binary file, sometimes referred to as a "GDS" file. At step 102, a removal region, namely embedded core region 12, is defined. This includes an area as well as a height, and thus metal interconnect layers are identified by whether they extend over and/or into such an embedded-core region 12. However, other metal layers may be above this height, so they will not be terminated at boundary 17 in order for P&R to an embedded core, including any glue logic for coupling such an embedded core to programmable logic circuit 11. Notably, if available, a physical layout database may be used prior to conversion to a binary file, and accordingly conversion from a binary file to a text file may therefore be avoided.

At step 103, those metal layers selected at step 102 as encroaching into embedded core region 12 based on coordinate locations and elevation are extracted. Thus, a list of terminated conductive lines is obtained, at least as a binary version of information. This list may be parsed at step 104 into respective conductive layers. For example, information for metal layer 3, 4, and 5 may be parsed into separate bins. These are merely examples of metal layers and lower and higher or different metal layers may be used.

At step 105, extensions for each of such metal layers for terminated signals are created. These extensions correspond to pins 18, which may later be used for interconnectivity with an embedded core, including any accompanying glue logic. As cross-sectional area of a metal line is the same for an extension as it is for the original metal line from which it is extended, extensions 18 may be automatically done with a P&R tool. It should be appreciated that as a matter of course all terminated lines may be extended a determined amount. However, as mentioned above, the length of such extensions or the extent to which they extend into embedded core region 12 is a designer's choice. Moreover, as layout coordinate information is associated with physical or layout signal names, creating extensions of such metal lines may be done using the coordinate system of integrated circuit 11 as opposed to having to transpose or shift coordinates for embedded core region 12.

Though all terminated signal lines may be extended, does not mean that all such terminated signal lines are used for interconnecting to an embedded device, embedded core and glue logic. Recall that these terminations are from a pre-existing layout of an integrated circuit device, such as a programmable logic device, designed without an embedded core. Thus, some terminated lines may be from FPGA-to-FPGA, for example, and not from FPGA-to-embedded core and vice versa.

At step 106, physical names and location coordinate information for each of the terminated lines identified at step 103 is obtained. In other words, binary information for the terminated lines is converted to a textual version thereof. Thus, a list of terminated signals at embedded core region 12 may be obtained for affected metal layers. Notably, this list includes physical or layout name and coordinate information for each of the terminated signals. A look-up table of schematic names as associated with physical names is accessed at step 107, and each physical signal name obtained is mapped to a schematic name using such a look-up table, thereby obtaining the associated schematic name for each of the physical names and coordinates identified.

It is important to realize, especially for programmable logic circuits, blocks which are repeated in a design, for example configurable logic locks, may use the same signal names over and over. However, though the same signal names are used, they represent different signals, as multiple configuration logic blocks exist on a programmable logic device. Accordingly, signal name and location are needed. At step 108, schematic names identified at step 106 are converted to logical names using a mapping table or other convention. Such logical names are according to a convention for a P&R tool, and such logical names are associated with coordinates obtained.

Figure 5:
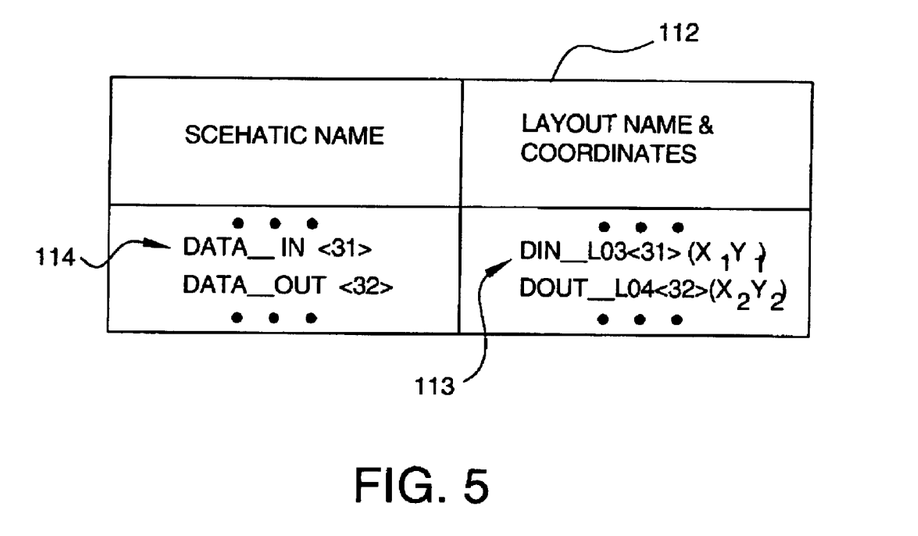
FIG. 5 is a table diagram of an exemplary portion of a looked-up table in accordance with one or more aspects of the present invention.

In order to describe mapping, an example is used. FIG. 5 is a table diagram of an exemplary portion of a looked-up table 112 in accordance with one or more aspects of the present invention. By way of example, suppose from table 112 at step 106 data at metal layer 3 for a data input signal, namely, din_L03<31> signal, was identified at coordinates $(x_1,y_1)$, namely, item 113 in table 112. Such a layout name and coordinates therefore would be associated via a lookup table with a schematic name for such a data input signal, namely data_in <31> signal or item 114 from table 112.

Figure 6:
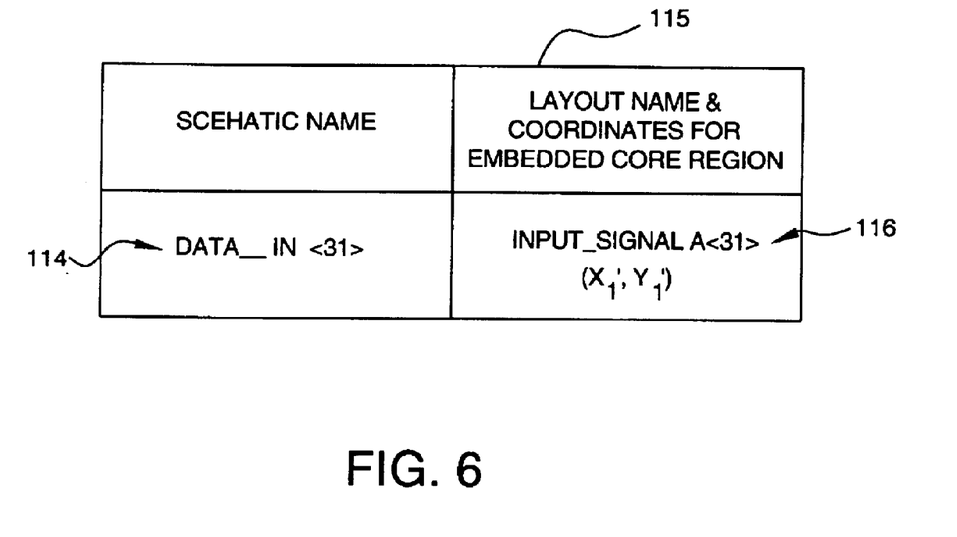
FIG. 6 is a table diagram of an exemplary portion of a schematic name to logic name mapping table in accordance with one or more aspects of the present invention.

Referring to FIG. 6, there is shown a table diagram of an exemplary portion of a schematic name to logic name mapping table 115 in accordance with one or more aspects of the present invention. Continuing the above example with respect to FIG. 5, data_in <31> signal, namely item 114, is converted to a logic name, for example input_signalA<31> or item 116 of mapping table 115.

With continuing reference to FIG. 6 and renewed reference to FIGS. 4 and 5, conversion from schematic name to logic name is done at step 108. At step 109 coordinates are converted using association between logic name and coordinates to layout name and coordinates owing to common association with a schematic name. So, continuing the above example, coordinates $(x_1,y_1)$ from an integrated circuit domain are mapped to coordinates to $(x_1',y_1')$ of a reserved embedded core region domain. Continuing the example of having an origin at location (a,b), $(x_1',y_1')$ would equal $((x_1-a),(y_1-b))$. Thus, embedded core region 12 signals to be interconnected are mapped to an embedded core domain, for example having a (0,0) point of reference, as indicated in FIG. 3, instead of (a, b).

After each of the signals terminated for embedded core region 12 for the selected layers is identified by schematic name and converted over to logic name and coordinates for an embedded core region domain, a list of all these signals and their respective coordinates may be created as a data exchange format (DEF) file at step 110. Such a file may be provided to a P&R tool at step 111.

Figure 7:
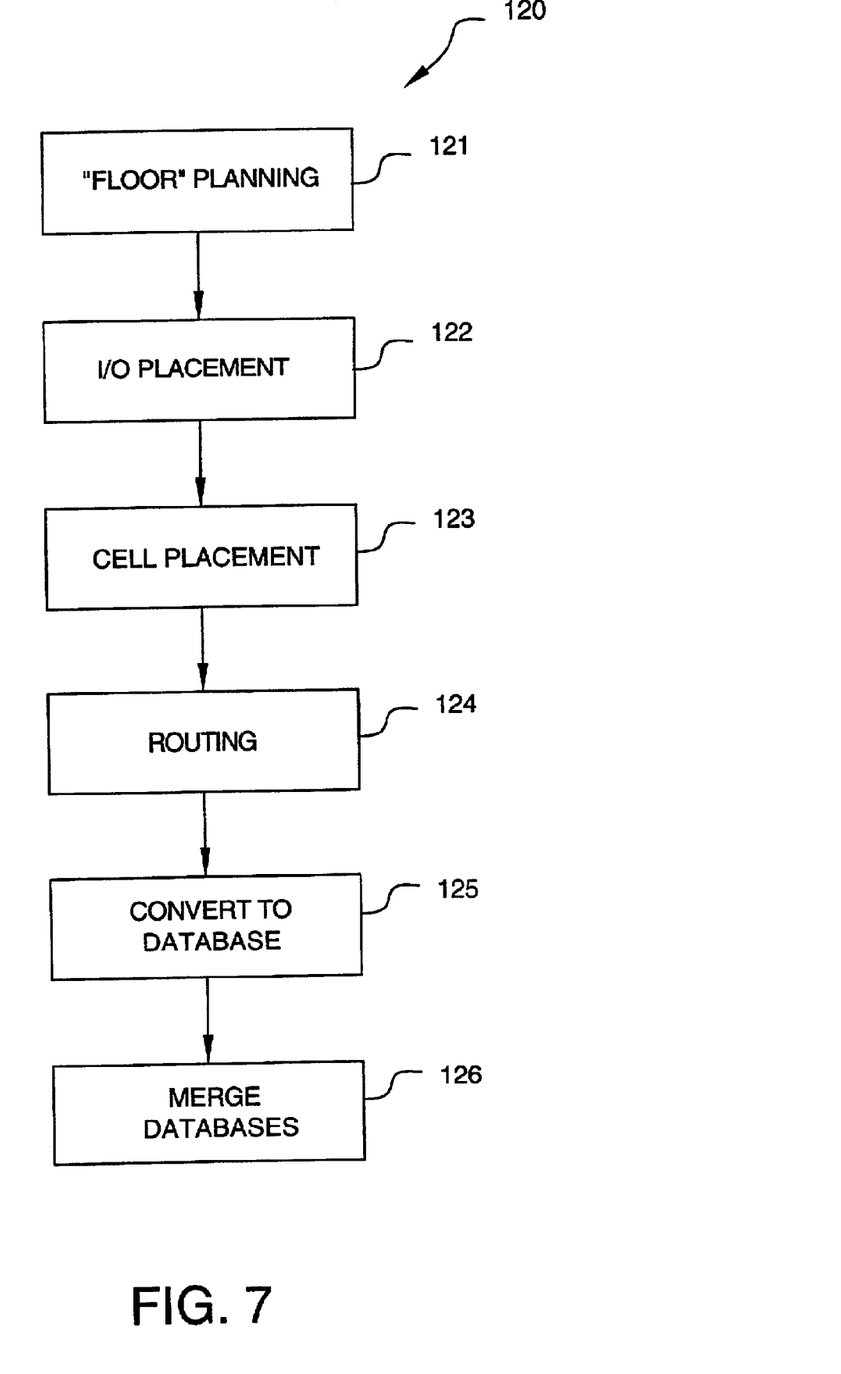
FIG. 7 is a process flow diagram of an exemplary embodiment of a place and route process in accordance with one or more aspects of the present invention.

Referring to FIG. 7, there is shown a process flow diagram of an exemplary embodiment of a P&R process 120 in accordance with one or more aspects of the present invention. At step 121 architectural or "floor" planning for placement of circuitry blocks, including an embedded core and standard cells, is done for embedded core region 12. At step 112, I/O placement is done. I/O placement comprises obtaining the above-mentioned list of logical names and coordinates, from example as a DEF file. At step 123 placement of a cell is done, namely, placement of the planned layout of embedded core and glue logic with I/O locations. I/O locations are locations for pins 18.

At step 124 routing for an embedded core and glue logic, including routing to and from I/O pins using a DEF file obtained from step 111, is done by a P&R tool. At step 125 layout routing done at step 124 is converted from text to a binary version, namely, a binary database or tapeout database. At step 126, the database obtained at step 101 less a removed portion at step 102 is merged with GDS out from step 125. Such a merger may include transformation of coordinates from an embedded core domain to a domain for integrated circuit 110.

Accordingly, it should be appreciated that by creating metal extensions, locations for connecting to metal lines are provided. Next, an insertable block tile is created, as signal name and location information from a layout database may be determined for terminated lines, which signal name and location information may be used for interconnect (programmable logic device to/from embedded core device) and intraconnect (programmable logic device to programmable logic device) routing. Thus, because pins using the coordinate system of the integrated circuit are used as starting points for placement and routing, an block tile which may be inserted back into the integrated circuit layout has been created thereby avoiding at least a significant amount of manual layout work.

Figure 8:
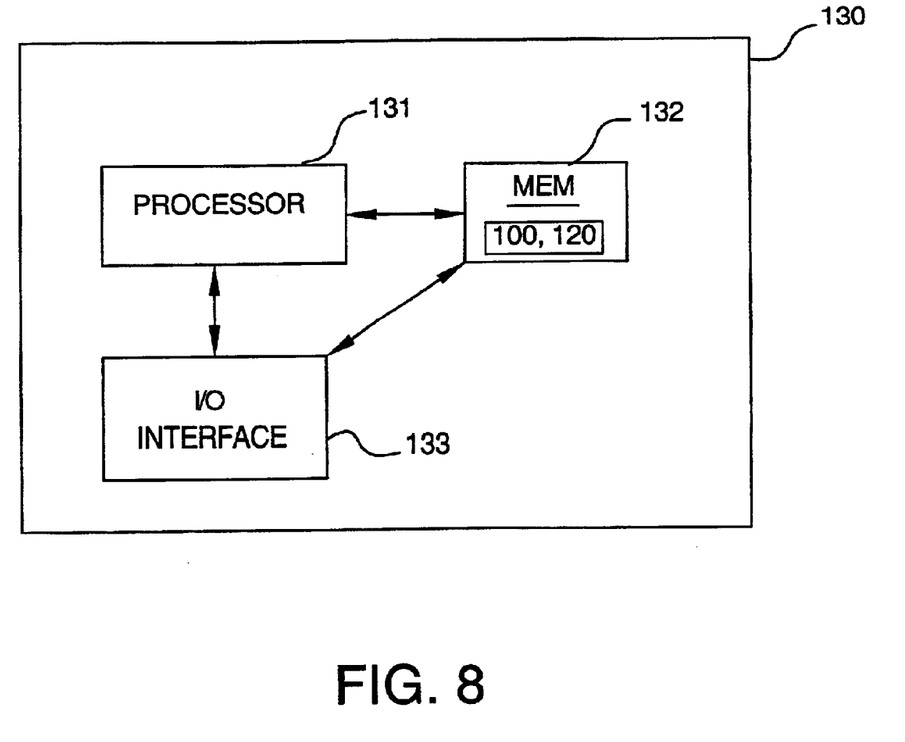
FIG. 8 is a block diagram of a computer system in accordance with one or more aspects of the present invention.

Referring to FIG. 8, there is shown a block diagram of a computer system 130 in accordance with one or more aspects of the present invention. Processor 131 is coupled to memory 132, and I/O interface 133. I/O interface 133 may be coupled to memory 132 as is known for direct memory addressing. Memory 132 may comprise all or a portion of processes 100 and/or 120 from time to time. Computer system 130 may be programmed with a P&R tool.

Embodiments of the present invention may be implemented as program products for use with a computer system 130. The program(s) of the program product defines functions of the embodiments and can be contained on a variety of signal/bearing media, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

Although various embodiments which incorporate the teachings of the present invention have been shown and described in detail herein, those skilled in the art can readily devise many other varied embodiments that still incorporate these teachings. Claims listing steps do not imply any order of the steps unless such order is expressly indicated.

All trademarks are the property of their respective owners.

What is claimed is:

1. A method for providing an insertable block tile for an integrated circuit having a region reserved for an embedded device, comprising:

providing a physical layout database for the integrated circuit;

applying the region reserved to the physical layout database;

removing a portion of the physical layout database in response to the region reserved;

extracting terminated conductive line information from the physical layout database in response to the portion of the physical layout database removed;

identifying layout names and associated coordinate information for the terminated conductive line information extracted;

converting the layout names to schematic names;

mapping logic names to the schematic names; and associating the associated coordinate information with the logic names to provide logic coordinate information.

2. The method of claim 1 wherein the step of associating comprises converting the associated coordinate information from a domain of the integrated circuit to a domain of the region reserved.

3. The method of claim 1 wherein the step of extracting terminated conductive line information is limited to an interface area between the integrated circuit and the portion of the physical layout database removed.

4. The method of claim 1 wherein the step of extracting the terminated conductive line information comprises limiting extraction to affected conductive layers.

5. The method of claim 4 further comprising creating extended metal portions in response to the terminated conductive line information and the conductive layers.

6. The method of claim 1 further providing the block tile to an input/output placement portion of a place and route tool.

7. The method of claim 6 further comprising routing the integrated circuit for connectivity with the blocked tile to provide another physical layout database.

8. The method of claim 7 further comprising merging the physical layout database with the other physical layout database.

9. The method of claim 1 wherein the step of identifying comprises converting a portion of a binary file of the physical layout database to a text version thereof.

10. The method of claim 1 further comprising providing the logic names and the logic coordinate information as a data exchange format file.

11. The method of claim 1 wherein the integrated circuit is a programmable logic device.

12. The method of claim 11 wherein the programmable logic device is a field programmable gate array, and wherein the embedded device is a microprocessor core and glue logic.

13. An integrated circuit having an embedded core interconnected thereto by a method comprising:

providing a physical layout database for the integrated circuit;

defining a portion of the physical layout database to be removed;

extracting terminated conductive line information from the physical layout database in response to the portion of the physical layout database removed;

identifying signal layout name and associated coordinate information for at least a portion of the terminated conductive line information extracted;

mapping the signal layout name and associated coordinate information to a schematic name;

assigning a logic name to the schematic name;

converting the associated coordinates from a domain of the integrated circuit to that of the removed portion of the integrated circuit; and linking the logic name to the associated coordinates converted.

14. The method of claim 13 further comprising laying out extended metal portions in response to the terminated conductive line information.

15. The method of claim 13 wherein the step of identifying comprises converting a portion of a binary file of the physical layout database to a text version thereof.

16. The method of claim 13 further comprising providing the logic name and the associated coordinates converted as part of a data exchange format file.

17. A signal-bearing medium containing a program which, when executed by a processor in response to removal of a portion of a layout database for an integrated circuit, causes execution of a method comprising:

extracting terminated conductive line information from the layout database responsive to the portion of the layout database removed;

laying out extensions of conductive lines in response to the terminated conductive line information;

identifying layout name and coordinate information responsive to the terminated conductive line information extracted;

mapping the layout name and coordinate information to a schematic name; and assigning a logic name to the schematic name.

18. The signal-bearing medium of claim 17 wherein the method further comprises the step of converting the coordinate information from the integrated circuit domain to a domain of the portion of the integrated circuit removed.

19. The method of claim 17 wherein the step of identifying comprises converting a portion of a binary file of the layout database to a text version thereof.

* * * * *